United States Patent
Yazawa

(10) Patent No.: US 6,519,019 B2
(45) Date of Patent: Feb. 11, 2003

(54) LIQUID CRYSTAL CONNECTED TO CIRCUIT SUBSTRATE AND BACKLIGHT VIA CONNECTOR

(75) Inventor: Kazuki Yazawa, Tokyo (JP)

(73) Assignee: Pentax Corporation, Tokyo (JP)

( * ) Notice: Subject to any disclaimer, the term of this patent is extended or adjusted under 35 U.S.C. 154(b) by 0 days.

(21) Appl. No.: 09/895,193

(22) Filed: Jul. 2, 2001

(65) Prior Publication Data

US 2002/0003595 A1 Jan. 10, 2002

(30) Foreign Application Priority Data

Jul. 6, 2000 (JP) ........................................ 2000-205173

(51) Int. Cl.[7] ........................... G02F 13/45; G02F 13/35
(52) U.S. Cl. .......................................... 349/149; 349/61
(58) Field of Search ............................ 349/58, 61, 149, 349/152

(56) References Cited

U.S. PATENT DOCUMENTS

| | | | |
|---|---|---|---|
| 4,118,111 A | * 10/1978 | Laesser | 349/149 |
| 5,270,847 A | 12/1993 | Sano | |
| 5,294,920 A | 3/1994 | Itabashi | |
| 5,386,309 A | * 1/1995 | Nam | 349/149 |
| 5,675,397 A | * 10/1997 | Fukushima | 349/149 |
| 5,774,199 A | * 6/1998 | Ozawa | 349/149 |
| 6,222,597 B1 | * 4/2001 | Muramatsu | 349/58 |

* cited by examiner

*Primary Examiner*—Parker Kenneth
(74) *Attorney, Agent, or Firm*—Greenblum & Bernstein, P.L.C.

(57) ABSTRACT

A backlighted liquid crystal display assembly mounted on a circuit substrate. The circuit substrate has contact pads formed thereon for electrical connection with the assembly. The assembly includes a liquid crystal display (LCD) screen panel and an electroluminescent (EL) panel for providing backlighting of the LCD screen panel. Each panels is formed as a thin, flat panel and has contact pads for external electrical connection. The assembly also includes a pair of electrical-interconnection rubber members, each having a plurality of conductive areas formed of a conductive rubber material and a plurality of insulating area formed of an insulating rubber material and separating the conductive areas from each other. A retainer structure retains the LCD screen panel, the EL panel and the rubber members to the mounting surface of the circuit substrate while keeping them in a predefined positional relationship such that (i) one of the rubber members has a first portion disposed and compressed between the LCD screen panel and the mounting surface of the circuit substrate and a second portion disposed and compressed between the LCD screen panel and the EL panel and (ii) the conductive areas of the rubber members are in contact with and provide electrical interconnection among the contact pads of the circuit substrate, the contact pads of the LCD screen panel and the contact pads of the EL panel.

15 Claims, 3 Drawing Sheets

LIQUID CRYSTAL CONNECTED TO CIRCUIT SUBSTRATE AND BACKLIGHT VIA CONNECTOR

The present disclosure relates to subject matter contained in Japanese Patent Application P2000-205173 filed on Jul. 6, 2000, which is expressly incorporated herein by reference in its entirety.

BACKGROUND OF THE INVENTION

1. Field of the Invention

The present invention relates to a backlighted liquid crystal display (LCD) assembly mounted on a circuit substrate.

2. Description of the Related Art

LCD's are widely used in applications where space and weight are limiting factors. One of such applications is information indicators used in compact electronic cameras, which provide visual information about various settings and conditions of a camera to, the camera user. Other compact, portable, electronic devices, such as mobile computers and cellular phones, may also often have an information display using an LCD. Because LCD's are not self-illuminating, some sort of backlighting is desirable in order for LCD's to be viewed even when electronic cameras or other portable electronic devices are used under night or other low light level conditions.

Light-emitting panels, such as electroluminescent (EL) panels, have been used for providing backlighting of LCD's because an EL panel can be formed as very thin panel so that it allows backlighted LCD's to have a highly reduced thickness. More specifically, a typical backlighted LCD assembly that is designed to be mounted on a circuit substrate includes an LCD screen panel formed as a thin, flat panel and an EL panel also formed as a thin, flat panel and disposed behind the LCD screen panel. The EL panel is disposed behind the LCD screen panel in order to provide backlighting of the LCD screen, and both of the panels are mounted on and electrically connected to the circuit substrate.

Generally, the space available for installation of a backlighted LCD assembly in an electronic camera or other portable electronic device is so limited that the assembly should be designed to have as reduced a thickness as possible. However, it has been often difficult to achieve a backlighted LCD with a sufficiently reduced thickness, primarily due to the required electrical connections between the circuit substrate and the LCD screen panel and between the circuit substrate and the EL panel. These electrical connections tend to increase the total thickness of the assembly. Further, these electrical connections may often lead to relatively high manufacturing costs of the assembly.

SUMMARY OF THE INVENTION

In view of the foregoing, it is an object of the present invention to provide a backlighted liquid crystal display assembly mounted on a circuit substrate, which includes a liquid crystal display (LCD) screen panel formed as a thin, flat panel and a light-emitting panel also formed as a thin, flat panel and providing backlighting of the LCD screen panel, wherein the required electrical connections between the circuit substrate and the LCD screen panel and between the circuit substrate and the light-emitting panel are improved in order to minimize the thickness of the assembly and/or reduce the manufacturing costs of the assembly.

In accordance with the present invention, there is provided a backlighted liquid crystal display assembly mounted on a circuit substrate. The circuit substrate has a mounting surface having contact pads formed thereon for electrical connection with the assembly. The assembly comprises: a liquid crystal display (LCD) screen panel formed as a thin, flat panel and having contact pads for external electrical connection; a light-emitting panel for providing backlighting of the LCD screen panel, the light-emitting panel being formed as a thin, flat panel and having contact pads for external electrical connection; at least one electrical-interconnection rubber member having a plurality of conductive areas formed of a conductive rubber material and at least one insulating area formed of an insulating rubber material and separating the plurality of conductive areas from each other; and a retainer structure which retains the LCD screen panel, the light-emitting panel and the at least one electrical-interconnection rubber member to the mounting surface of the circuit substrate while keeping them in a predefined positional relationship such that (i) the electrical-interconnection rubber member has a first portion disposed and compressed between the LCD screen panel and the mounting surface of the circuit substrate and a second portion disposed and compressed between the LCD screen panel and the light-emitting panel and (ii) the conductive areas of the electrical-interconnection rubber member are in contact with and provide electrical interconnection among the contact pads of the circuit substrate, the contact pads of the LCD screen panel and the contact pads of the light-emitting panel.

The LCD screen panel may have interconnection conductive traces formed thereon, each of which has opposite ends terminating at corresponding ones of the contact pads of the LCD screen panel. In such a case, the light-emitting panel and the circuit substrate may be electrically interconnected through the at least one electrical-interconnection rubber member and the interconnection conductive traces.

The LCD screen panel may have front and back surfaces, with the contact pads of the LCD screen panel being formed on the back surface of the LCD screen panel. The light-emitting panel may have front and back surfaces, with the contact pads of the light-emitting panel being formed on the front surface of the light-emitting panel. Further, the LCD screen panel and the light-emitting panel may be retained by the retainer structure such that (i) the back surface of the LCD screen panel and the front surface of the light-emitting panel are opposed to each other, (ii) the first portion of the electrical-interconnection rubber member is disposed and compressed between the back surface of the LCD screen panel and the mounting surface of the circuit substrate and (iii) the second portion of the electrical-interconnection rubber member is disposed and compressed between the back surface of the LCD screen panel and the front surface of the light-emitting panel.

The light-emitting panel may be retained to the mounting surface of the circuit substrate, with the back surface of the light-emitting panel being pressed against the mounting surface by resilient force of the at least one electrical-interconnection rubber member being compressed.

The LCD screen panel may be generally rectangular in shape and have a first pair of opposite side edges and a second pair of opposite side edges, with the contact pads of the LCD screen panel being arranged in a pair of rows extending along the first pair of opposite side edges, respectively. The at least one electrical-interconnection rubber member may comprise first and second bar-like electrical-interconnection rubber members extending along the first pair of opposite side edges, respectively, of the LCD screen panel. Further, the first bar-like electrical-interconnection rubber member may have a first portion disposed and compressed between the LCD screen panel and the mounting surface of the circuit substrate and a second portion disposed and compressed between the LCD screen panel and the light-emitting panel.

The light-emitting panel may be generally rectangular in shape and have a first pair of opposite side edges, a second pair of opposite side edges and a tab portion projecting from one of the first pair of opposite side edges, with the contact pads of the light-emitting panel being located on the tab portion. In such a case, the second portion of the first bar-like electrically-interconnection rubber member may be disposed and compressed between the LCD screen panel and the tab portion of the light-emitting panel.

The retainer structure may comprise a generally rectangular frame for receiving therein and locating the LCD screen panel, the light-emitting panel and the first and second bar-like electrical-interconnection rubber members relative to the frame.

In addition, the retainer structure may comprise a retainer cap for (i) retaining the rectangular frame at its desired positions on the mounting surface of the circuit substrate and (ii) engaging the front surface of the LCD screen panel along the side edges thereof to press the LCD screen panel against the bar-like electrical-interconnection rubber members so as to compress the latter.

BRIEF DESCRIPTION OF THE DRAWINGS

The above and other objects, features and advantages of the present invention will be apparent from the following detailed description of a preferred embodiment thereof, reference being made to the accompanying drawings, in which.

DETAILED DESCRIPTION OF A PREFERRED EMBODIMENT

Referring now to the accompanying drawings, a backlighted liquid crystal display assembly in accordance with a preferred embodiment of the present invention will be described in detail.

Figure 1:
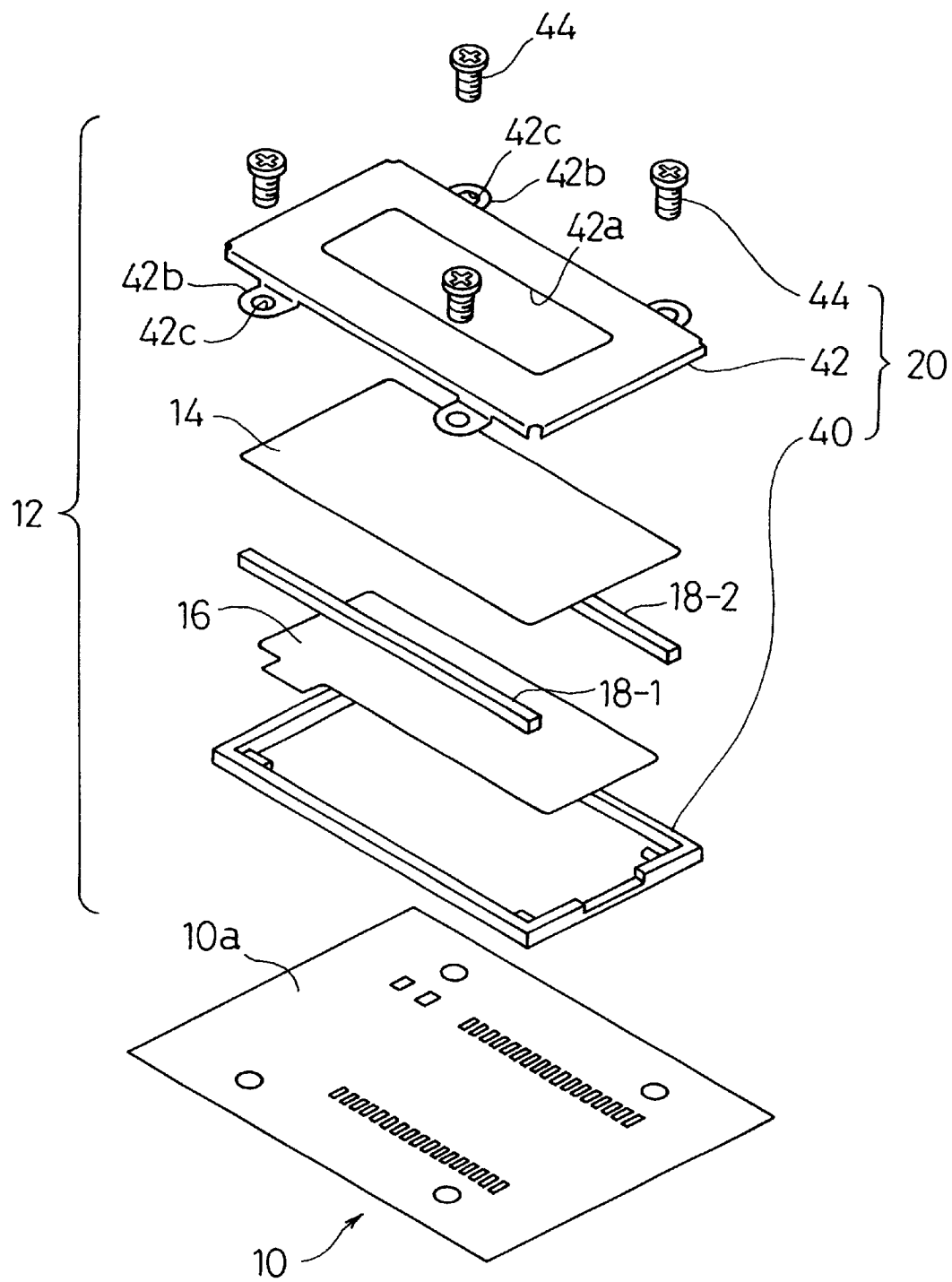
FIG. 1 is an exploded perspective view showing a backlighted liquid crystal display assembly constructed and arranged in accordance with a preferred embodiment of the present invention.
Figure 2:
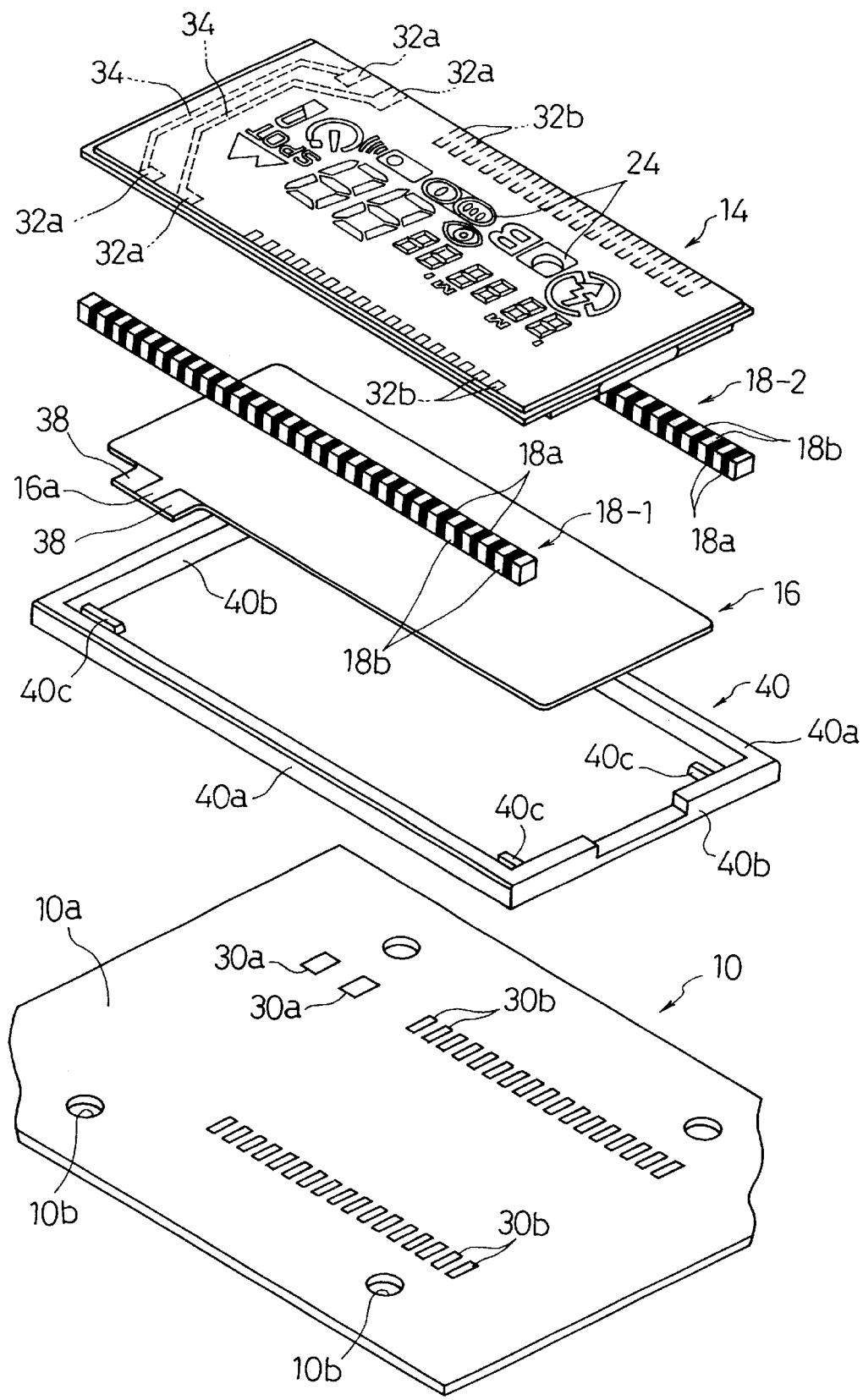
FIG. 2 is an enlarged perspective view showing some of the elements shown in FIG. 1.
Figure 3:
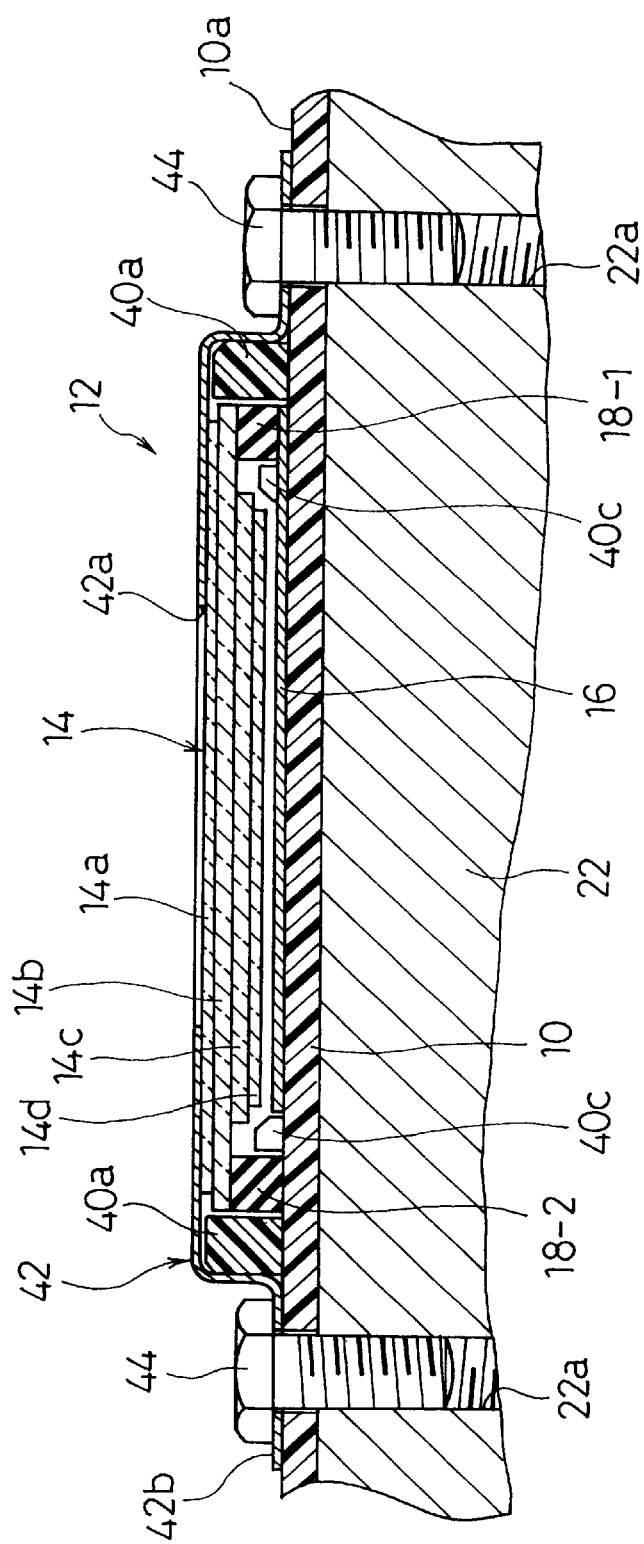
FIG. 3 is an enlarged cross-sectional view of the assembly of FIG. 1 mounted on a circuit substrate and supported on a chassis.

FIGS. 1 to 3 show a backlighted liquid crystal display assembly 12 constructed and arranged in accordance with a preferred embodiment of the present invention. The assembly 12 is mounted on a mounting surface 10a of a circuit substrate 10, as shown in FIG. 3. The assembly 12 comprises a liquid crystal display (LCD) screen panel 14, a light-emitting panel 16 for providing backlighting of the LCD screen panel 14, a pair of bar-like electrical-interconnection rubber members 18-1 and 18-2, and a retainer structure 20 for retaining and mounting the LCD screen panel 14, the light-emitting panel 16 and the rubber members 18-1 and 18-2 onto the mounting surface 10a of the circuit substrate 10. The light-emitting panel 16 is an electroluminescent (EL) panel of a known type, which is supplied with high frequency electric power to produce electroluminescent light.

The circuit substrate 10 is a printed circuit substrate having a lot of conductive traces (not shown) formed on a relatively thin substrate board. The conductive traces provide electrical interconnection between the assembly 12 and the associated circuits (not shown) for operating the assembly 12. Since the circuit substrate 10 is relatively thin in this embodiment, it can not provide sufficient support of the assembly 12. Rather, the assembly 12 and the circuit substrate 10 are both supported by the chassis 22 of an electronic device, which may be an electronic camera, a cellular phone or others (see FIG. 3). It is noted, however, the assembly of the present invention may be supported by a circuit substrate itself, if the circuit substrate has sufficient strength and rigidity. The chassis 22 has threaded holes 22a for securing the assembly 12 and the circuit substrate 10 to the chassis 22 by screws.

As shown in FIG. 2, the circuit substrate 10 has a plurality of contact pads or lands, which are formed on the mounting surface 10a for electrical connection with the assembly 12. Two of the contact pads, designated by 30a, are wider than the remainder. These wider contact pads 30a are used for supplying high frequency electric power to the EL panel 16, as described in more detail below. The remainder of the contact pads, designated by 30b, are used for supplying drive signals to the LCD screen panel 14. As shown in FIG. 2, the contact pads 30a, 30b on the mounting surface 10a are arranged in a pair of parallel rows. Further, in each of the contact pad rows, the contact pads 30b for the drive signals are spaced equidistantly with a fixed pitch.

The LCD screen panel 14 is formed as a thin, flat panel having front and back surfaces. As shown in FIG. 3, the LCD screen panel 14 has a layered structure including a front polarization plate 14a, a front glass substrate 14b, a back glass substrate 14c and a back polarization plate 14d stacked one on another in this order. As known in the art, a minute gap (not clearly shown in the figures) is defined between the front and back glass substrates 14b and 14c to create a confined space for an amount of liquid crystal to be filled and sealed therein. As shown in FIG. 2, the front and back glass substrates 14b and 14c have transparent front and back electrodes 24 having various shapes which correspond to the shapes of the icons and alphanumerical characters to be displayed on the LCD screen panel 14 when an appropriated voltage is applied to the corresponding electrodes 24.

As shown in FIGS. 1 and 2, the LCD screen panel 14 is generally rectangular in shape and has a first pair of opposite side edges (longer side edges) and a second pair of opposite side edges (shorter side edges). The LCD screen panel 14 has a plurality of contact pads or lands for external electrical connection, which are formed on the back surface of the panel and arranged in a pair of parallel rows extending along the longer side edges of the panel. Two of the contact pads, designated by 32a, in each of the contact pad rows on the LCD screen panel 14 are wider than the remainder. These wider contact pads 32a are used for transferring high frequency electric power from the circuit substrate 10 to the EL panel 16. The remainder of the contact pads on the LCD screen panel 14, designated by 32b, are used for receiving drive signals from the circuit substrate 10. The LCD screen panel 14 has a plurality of transparent conductive traces (not shown) formed thereon, through which the contact pads 32b for drive signals are connected to the corresponding electrodes 24. Further, in each of the contact pad rows, the contact pads 32b for drive signals are spaced equidistantly with a fixed pitch, which is equal to the pitch of the contact pads 30b formed on the circuit substrate 10.

The LCD screen panel 14 further has a pair of conductive traces 34 formed thereon, which are exclusively used for electrical interconnection between the circuit substrate 10 and the EL panel 16. These conductive traces 34 are referred to as the "interconnection traces" hereinafter. The pair of wider contact pads 32a in each contact pad row on the LCD screen panel 14 are connected to the pair of interconnection traces 34. In other words, the interconnection traces 34 have their first ends terminating at the pair of contact pads 32a in one contact pad row and their second ends terminating at the pair of contact pads 32a in the other contact pad row.

The EL panel 16 is formed as a thin, flat panel having front and back surfaces. As shown, the EL panel 16 is generally rectangular in shape and has a first pair of opposite side edges (longer side edges) and a second pair of opposite side edges (shorter side edges). The longer side edges of the EL panel 16 have a length substantially equal to the length of the longer side edges of the LCD screen panel 14, while the shorter side edges of the EL panel 16 have a length shorter than the length of the shorter side edges of the LCD screen panel 14. The EL panel 16 has a small projection or tab portion 16a projecting from one of the longer side edges. The EL panel 16 has a pair of contact pads 38, which are formed on the front surface of the EL panel 16 and located on the tab portion 16a. The EL panel 16 receives electrical power through the pair of contact pads 38.

The first and second bar-like electrical-interconnection rubber members 18-1 and 18-2 are identically the same. The rubber members have a plurality of conductive areas 18a formed of a conductive rubber material and a plurality of insulating area 18b formed of an insulating rubber material. The conductive areas 18a and the insulating areas 18b are alternately arranged or stacked, so that the insulating areas 18b separate the conductive areas 18a from each other. Similar electrical-interconnection rubber members are known in the art and used for electrical interconnection between separate electronic parts. As seen from FIG. 2, the rubber member 18 has a highly symmetrical structure, i.e., it has a square cross section, it has the conductive areas 18a spaced equidistantly with a fixed pitch, and it terminates with insulating areas 18b at both ends. The pitch of the conductive areas 18a is equal to the above-mentioned pitch of the contact pads 30b or 32b for drive signals.

The retainer structure 20 retains the LCD screen panel 14, the EL panel 16 and the electrical-interconnection rubber members 18-1 and 18-2 to the mounting surface 10a of the circuit substrate 10 while keeping them in a predefined positional relationship. The retainer structure 20 comprises a frame 40, a retainer cap 42 and a set of screws 44.

The frame 40 is generally rectangular in shape and receives therein the LCD screen panel 14, the EL panel 16 and the rubber members 18-1 and 18-2. The frame 40 has a first pair of opposite side members 40a (longer side members) and a second pair of opposite side members 40b (shorter side members). The shorter side members 40b each has a pair of inward projections 40c.

The frame 40 has dimensions corresponding to the elements to be received therein. Specifically, the longer side members 40a and the shorter side members 40b of the frame 40 have their inner edges adapted for engagement with the four side edges of the LCD screen panel 14, and by this engagement the LCD screen panel 14 is located relative to the frame 40 in accuracy. The shorter side members 40b and the inward projections 40c are adapted for engagement with the side edges of the EL panel 16, and by this engagement the EL panel 16 is located relative to the frame 40 in accuracy. In addition, the longer side members 40a, the shorter side members 40b and the inward projections 40c cooperate to locate the pair of rubber members 18-1 and 18-2 relative to the frame 40 in accuracy.

The retainer cap 42 has a shape corresponding to that of the frame 40, and thus is generally rectangular in shape. The retainer cap 42 is made from a thin, metallic sheet punched and stamped. The retainer cap 42 has a central window 42a and four lugs 42b with lug holes 42c for the screws 44 to extend through. The window 42a allows the central display area of the LCD screen panel 14 to be viewed therethrough. The retainer cap 42, when secured to the chassis 22 by means of the screws 44 as shown in FIG. 3, covers the frame 40 and retains it together with the LCD screen panel 14, the EL panel 16 and the rubber members 18-1 and 18-2 to the circuit substrate 10 and to the chassis 22. The circuit substrate 10 has through holes 10b for the screws 44 to extend through. The through holes 10b are formed in accurate positions relative to the contact pads 30a, 30b formed on the circuit substrate 10. Thus, securing of the screws 44 finally achieves accurate positioning of the elements of the assembly 12 relative to the mounting surface 10a of the circuit substrate 10 and thus to the contact pads 30a, 30b formed thereon.

More specifically, the assembling process is performed as follows. For easiness of the assembling process, it is desirable to orient the chassis 22 such that the circuit substrate 10 placed on the chassis 22 extends in the horizontal direction with its mounting surface 10a facing upward, as shown in the figures. Thus, in the following description, it is assumed that the circuit substrate 10 is so oriented.

After the circuit substrate 10 is place on the chassis 22, the frame 40 is first placed on the mounting surface 10a of the circuit substrate 10, and then the EL panel 16, the rubber members 18 and the LCD screen panel 14 are inserted in this order into respective spaces defined for them in the frame 40. Thereafter, the retainer cap 42 is placed to cover the frame 40 together with the elements inserted therein, and the screws 44 are fastened into the threaded holes 22a of the chassis 22 to secure the retainer cap 42 to the circuit substrate 10. In this manner, the assembly 12 is completed.

When the elements are inserted and set in their positions in the frame 40, the following are automatically achieved by the above-described engagement between each element and the frame 40.

(i) The back surface of the LCD screen panel 14 and the front surface of the EL panel 16 are opposed to each other so that the EL panel 16 is disposed behind the LCD screen panel 14 to provide backlighting of the LCD screen panel 14.

(ii) The first rubber member 18-1 has a first portion disposed between the back surface of the LCD screen panel 14 and the mounting surface 10a of the circuit substrate 10 and a second portion disposed between the back surface of the LCD screen panel 14 and the front surface of the EL panel 16, while the second rubber member 18-2 is disposed between the back surface of the LCD screen panel 14 and the mounting surface 10a of the circuit substrate 10.

(iii) The contact pads 30b of the circuit substrate 10 for drive signals are vertically aligned to the corresponding contact pads 32b of the LCD screen panel 14, with the corresponding conductive areas 18a of the rubber members 18-1 and 18-2 being also aligned to the associated contact pads.

(iv) The pair of contact pads 38 of the EL panel 16 are vertically aligned to the pair of wider contact pads 32a in the first contact pad row of the LCD screen panel 14, with the corresponding conductive areas 18a of the first rubber member 18-1 being between the associated contact pads.

(v) The pair of wider contact pads 30a of the circuit substrate 10 are vertically aligned to the pair of wider contact pads 32a in the second contact pad row of the LCD screen panel 14, with the corresponding conductive areas 18a of the second rubber member 18-2 being between the associated contact pads.

When the retainer cap 42 is not yet attached, the LCD screen panel 14 has its front or top surface at the level slightly higher than the top surface of the frame 40. By attaching the retainer cap 42 to cover the frame 40 and fastening the screws 44, the retainer cap 42 engages the front surface of the LCD screen panel 14 along the side edges thereof to press the LCD screen panel 14 against the rubber members 18-1 and 18-2 so as to compress the rubber members 18-1 and 18-2.

The resilient force produced by the compressed rubber members 18-1 and 18-2 ensures electrical connection between the contact pads and the associated conductive areas 18a of the rubber members 18-1 and 18-2. As the result, the contact pads 30b (for drive signals) of the circuit substrate 10 and the corresponding contact pads 32b (for drive signals) of the LCD screen panel 14 are electrically interconnected through the corresponding conductive areas 18a of the rubber members 18-1 and 18-2.

Similarly, the pair of contact pads 38 of the EL panel 16 and the pair of wider contact pads 32a in the first contact pad row of the LCD screen panel 14 are electrically interconnected through the corresponding conductive areas 18a of the first rubber member 18-1. Also, the pair of wider contact pads 30a of the circuit substrate 10 and the pair of wider contact pads 32a in the second contact pad row of the LCD screen panel 14 are electrically interconnected through the corresponding conductive areas 18a of the second rubber member 18-2. Thus, the electrical pass for powering the EL panel 16 is completed by the first electrical-interconnection rubber member 18-1, the pair of wider contact pads 32a in the first contact pad row of the LCD screen panel 14, the interconnection traces 34 formed on the LCD screen panel 14, the pair of wider contact pads 32a in the second contact pad row of the LCD screen panel 14, the second electrical-interconnection rubber member 18-2, the pair of wider contact pads 30a of the circuit substrate 10 and the conductive traces formed on the circuit substrate 10. In other words, the EL panel 16 and the circuit substrate 10 are electrically interconnected through the electrical-interconnection rubber members 18-1 and 18-2 and the interconnection traces 34 formed on the LCD screen panel 14.

The resilient force produced by the compressed first rubber member 18-1 also serves to retain the EL panel 16 to the mounting surface 10a of the circuit substrate 10, with the back surface of the EL panel 16 being pressed against the mounting surface 10a by the resilient force acting on the tab portion 16a of the EL panel 16.

As clearly understood from the above, the electrical-interconnection rubber members 18-1 and 18-2 are in contact with and provide electrical interconnection among the contact pads 30a, 30b of the circuit substrate 10, the contact pads 32a, 32b of the LCD screen panel 14 and the contact pads 38 of the EL panel 16. The rubber members 18-1 and 18-2 also cooperate with the retainer structure 20 to produce resilient force, which is advantageously used to hold the elements of the assembly 12 in positions. The retainer structure 20 is simple and highly effective in locating the elements of the assembly in accuracy as well as simplifying the assembling process of the assembly. Thus, the present invention proposes a simple and compact arrangement for a backlighted liquid crystal display assembly mounted on a circuit substrate, with which the thickness of the assembly may be minimized and the manufacturing costs of the assembly may be reduced.

Having described the present invention with reference to the preferred embodiment thereof, it is to be understood that the present invention is not limited to the disclosed embodiment, but may be embodied in various other forms without departing from the spirit and the scope of the present invention as defined by the appended claims.

What is claimed is:

1. A backlighted liquid crystal display assembly mounted on a circuit substrate, said circuit substrate comprising a mounting surface having contact pads enabling electrical connection with said assembly, said assembly comprising:

a liquid crystal display (LCD) screen panel, comprising contact pads for external electrical connection and interconnection conductive traces, each of the interconnection conductive traces having opposite ends terminating at corresponding contact pads;

a light-emitting panel that provides backlighting of said LCD screen panel, said light-emitting panel comprising contact pads for external electrical connection; and at least one electrical-interconnection resilient member comprising a plurality of conductive areas, formed of a conductive resilient material, and at least one insulating area, formed of an insulating resilient material and separating said plurality of conductive areas from each other resilient member to said mounting surface of said circuit substrate while keeping them in a predefined positional relationship such that (i)], said electrical-interconnection resilient member comprising a first portion compressed between said LCD screen panel and said mounting surface of said circuit substrate and a second portion compressed between said LCD screen panel and said light-emitting panel;

wherein the conductive areas of said electrical-interconnection resilient member provide electrical interconnection among the contact pads of said circuit substrate, the contact pads of said LCD screen panel and the contact pads of said light-emitting panel, the electrical interconnection between said light-emitting panel and said circuit substrate being enabled by the interconnection conductive traces of said LCD screen.

2. The backlighted liquid crystal display assembly according to claim 1, wherein:

said LCD screen panel comprises a front surface and a back surface, the contact pads of said LCD screen panel being formed on the back surface of said LCD screen panel;

said light-emitting panel comprises a front surface and a back surface, the contact pads of said light-emitting panel being formed on the front surface of said light-emitting panel; and said LCD screen panel and said light-emitting panel are positioned such that (i) the back surface of said LCD screen panel and the front surface of said light-emitting panel are opposed to each other, (ii) the first portion of said electrical-interconnection resilient member is compressed between the back surface of said LCD screen panel and the mounting surface of said circuit substrate and (iii) the second portion of said electrical-interconnection resilient member is compressed between the back surface of said LCD screen panel and the front surface of said light-emitting panel.

3. The backlighted liquid crystal display assembly according to claim 2 wherein:

the back surface of said light-emitting panel is held in place against the mounting surface of said circuit substrate by a resilient pressing force of said at least one compressed electrical-interconnection resilient member.

4. The backlighted liquid crystal display assembly according to claim 3, wherein:

said LCD screen panel is generally rectangular in shape and has a first pair of opposite side edges and a second pair of opposite side edges, said contact pads of said LCD screen panel being arranged in a pair of rows extending along said first pair of opposite side edges, respectively; and said at least one electrical-interconnection resilient member comprises a first bar-like electrical-interconnection resilient member and a second bar-like electrical-interconnection resilient member, respectively extending along the first pair of opposite side edges of said LCD screen panel; and said first bar-like electrical-interconnection resilient member has the first portion compressed between said LCD screen panel and the mounting surface of said circuit substrate and the second portion compressed between said LCD screen panel and said light-emitting panel.

5. The backlighted liquid crystal display assembly according to claim 4, wherein:

said light-emitting panel is generally rectangular in shape and has a first pair of opposite side edges, a second pair of opposite side edges and a tab portion projecting from one of the first pair of opposite side edges, the contact pads of said light-emitting panel being located on the tab portion; and the second portion of said first bar-like electrical-interconnection resilient member is compressed between said LCD screen panel and the tab portion of said light-emitting panel.

6. The backlighted liquid crystal display assembly according to claim 5, further comprising:

a retainer structure, comprising a generally rectangular frame, that retains said LCD screen panel, said light-emitting panel and each of said first bar-like electrical-interconnection resilient member and said second bar-like electrical-interconnection resilient member in a predetermined positional relationship, said first and second bar-like electrical-interconnection resilient members being held in a compressed condition.

7. The backlighted liquid crystal display assembly according to claim 6, wherein:

said retainer structure comprises a retainer cap for (i) retaining the rectangular frame at a predetermined position on the mounting surface of said circuit substrate and (ii) engaging the front surface of said LCD screen panel along the first pair of side edges and the second pair of side edges to press said LCD screen panel against said first and second bar-like electrical-interconnection resilient members.

8. A liquid crystal display assembly mounted on a circuit substrate, said liquid crystal display assembly comprising:

a liquid crystal display (LCD) screen panel;

a light-emitting panel that provides backlighting of said LCD screen panel; and at least one electrical-interconnection resilient member that electrically interconnects said LCD screen panel, said light-emitting panel and said circuit substrate, through a plurality of conductive areas and at least one insulating area separating the plurality of conductive areas, said at least one electrical-interconnection resilient member comprising a first compressible portion, contacting said LCD screen panel and the circuit substrate, and a second compressible portion, contacting said LCD screen panel and said light-emitting panel.

9. The liquid crystal display assembly according to claim 8, the plurality of conductive areas comprising a conductive resilient material and the at least one insulating area comprising an insulating resilient material.

10. The liquid crystal display assembly according to claim 9, said LCD screen panel comprising a plurality of interconnection conductive traces enabling electrical interconnection between said light-emitting panel and said circuit substrate.

11. The liquid crystal display assembly according to claim 8, further comprising a retainer structure that retains said LCD screen panel, said light-emitting panel and said at least one electrical-interconnection resilient member in predetermined respective positions, said retainer structure holding the first portion and the second portion of said at least one electrical-interconnection resilient member in a compressed condition.

12. A liquid crystal display assembly mounted on a circuit substrate, said liquid crystal display assembly comprising:

a liquid crystal display (LCD) screen panel;

a light-emitting panel that provides backlighting of said LCD screen panel;

a first electrical-interconnection resilient member, comprising a first compressible portion, compressed between said LCD screen panel and the circuit substrate, and a second compressible portion, compressed between said LCD screen panel and said light-emitting panel, the first compressible portion contacting said LCD screen panel and said circuit substrate and the second compressible portion contacting said LCD screen panel and said light-emitting panel; and a second electrical-interconnection resilient member, compressed between said LCD screen panel and the circuit substrate;

each of said first and second electrical-interconnection members enabling electrical interconnection among said LCD screen panel, said light-emitting panel and the circuit substrate, and comprising a plurality of conductive areas and at least one insulating area separating the plurality of conductive areas.

13. The liquid crystal display assembly according to claim 12, the plurality of conductive areas comprising a conductive resilient material and the at least one insulating area comprising an insulating resilient material.

14. The liquid crystal display assembly according to claim 12, said light-emitting panel comprising a tab portion, wherein the second compressible portion of said first electrical-interconnection resilient member contacting the tab portion of said light-emitting panel.

15. The liquid crystal display assembly according to claim 14, said LCD screen panel comprising a plurality of interconnection conductive traces enabling electrical interconnection between said light-emitting panel and said circuit substrate.

* * * * *